US007939992B2

(12) United States Patent
Ehrlich

(10) Patent No.: US 7,939,992 B2
(45) Date of Patent: May 10, 2011

(54) ELECTRICAL SWITCH ELEMENT, PARTICULARLY A RELAY, WITH SWIVELLING LEVER SWITCH MECHANISM

(75) Inventor: Heinz-Michael Ehrlich, Berlin (DE)

(73) Assignee: Tyco Electronics AMP GmbH, Bensheim (DE)

( * ) Notice: Subject to any disclaimer, the term of this patent is extended or adjusted under 35 U.S.C. 154(b) by 313 days.

(21) Appl. No.: 12/282,115

(22) PCT Filed: Mar. 5, 2007

(86) PCT No.: PCT/EP2007/001862
§ 371 (c)(1),
(2), (4) Date: Sep. 8, 2008

(87) PCT Pub. No.: WO2007/101638
PCT Pub. Date: Sep. 13, 2007

(65) Prior Publication Data

US 2009/0145734 A1 Jun. 11, 2009

(30) Foreign Application Priority Data

Mar. 7, 2006 (DE) ........................ 10 2006 010 828

(51) Int. Cl.
*H01L 41/08* (2006.01)
*H01H 51/22* (2006.01)

(52) U.S. Cl. ........ 310/328; 200/553; 200/239; 200/250; 335/78

(58) Field of Classification Search ........... 200/6 R–6 C, 200/16 R–16 D, 553, 557, 559, 561, 239, 200/240, 250; 335/78, 181, 106, 132, 128, 335/201; 310/323, 328
See application file for complete search history.

(56) References Cited

U.S. PATENT DOCUMENTS

| | | | | | |
|---|---|---|---|---|---|
| 2,564,246 | A * | 8/1951 | Bourne | 335/181 |
| 2,694,758 | A * | 11/1954 | Keen | 335/161 |
| 3,515,831 | A * | 6/1970 | Kerber et al. | 200/509 |
| 4,570,095 | A | 2/1986 | Uchikawa | |
| 4,675,568 | A | 6/1987 | Uchikawa et al. | |
| 5,270,984 | A * | 12/1993 | Mine | 367/140 |
| 6,027,260 | A * | 2/2000 | Oda et al. | 396/497 |
| 6,157,115 | A * | 12/2000 | Hassler, Jr. | 310/328 |
| 6,969,365 | B2 * | 11/2005 | Scorvo | 602/16 |
| 7,286,030 | B2 * | 10/2007 | Janot et al. | 335/78 |
| 7,304,556 | B2 * | 12/2007 | Tamura et al. | 335/78 |
| 2005/0198904 | A1 * | 9/2005 | Browne et al. | 49/374 |
| 2005/0241375 | A1 * | 11/2005 | Naughton | 73/105 |
| 2006/0273871 | A1 * | 12/2006 | Busta et al. | 335/78 |
| 2009/0165877 | A1 * | 7/2009 | Den Toonder et al. | 137/831 |

FOREIGN PATENT DOCUMENTS

| | | | |
|---|---|---|---|
| EP | 1626427 | A2 | 2/2006 |
| JP | 59175386 | | 10/1984 |

* cited by examiner

*Primary Examiner* — Michael A Friedhofer
(74) *Attorney, Agent, or Firm* — Barley Snyder LLC

(57) ABSTRACT

An electrical switch element, particularly a relay, is provided with an actuator with a switch contact and a switch mechanism. The switch mechanism translates a driving movement of the actuator into a switching movement of the switch contact so that the switch contact is brought into and out of contact with a mating contact. In order to create a switching movement with a large lift in the case of an actuator which can only execute a driving movement with small lift, the switch mechanism has two swivelling levers connected to each other via the actuator and at least one contact retainer. The contact retainer connects the two swivelling levers in its longitudinal direction with a lever arm larger than the actuator and is configured so it can be deflected transverse to its longitudinal direction.

17 Claims, 2 Drawing Sheets

ELECTRICAL SWITCH ELEMENT, PARTICULARLY A RELAY, WITH SWIVELLING LEVER SWITCH MECHANISM

CROSS-REFERENCE TO RELATED APPLICATIONS

This application is a National Stage Application filed under 35 U.S.C. §371 of PCT International Application No. PCT/EP2007/001862, filed on Mar. 5, 2008, which claims priortiy to German Patent Application No. 10 2006 010 828, filed Mar. 7, 2006.

FIELD OF THE INVENTION

The invention relates to an electrical switch element, particularly a relay, with at least one actuator, with at least one switch contact and with a switch mechanism, through which a driving movement of the actuator can be translated into a switching movement of the switch contact.

BACKGROUND

This type of construction of electrical switch elements is known, for example, in the case of relays. A coil-armature combination is usually used as an actuator in the case of relays, where the armature is moved against a spring force by a magnetic force built up by the coil. The movement of the armature when the coil is switched on, the driving movement, is transferred to the switch contact by a switch mechanism, usually a simple connecting rod running parallel to the coil, which then carries out a switching movement and is brought into contact or out of contact with a stationary mating contact. In this way a circuit connecting the switch contact and the mating contact is broken or made in the process by an activation of the actuator.

In this known construction, the lift of the switching movement is the same as the driving lift of the actuator. That is disadvantageous in that in the case of an actuator with only slight lift resulting from its construction, the lift of the switching movement can be insufficient to separate the switch contact and the mating contact far enough away from each other and prevent a spark between the switch contact and the mating contact.

Therefore, the lift of the actuator is increased by a lever arrangement in some electrical switch elements, such as the relay described in EP 1 626 427 A2. The arrangement known from this document is, however, still not sufficient for actuators with very low lift.

An object of the invention is therefore to develop the known electrical switch elements so that even actuators with particularly low lift can be used, without there being the possibility of an uncontrolled spark.

SUMMARY

An electrical switch element is achieved according to the invention in that the switch mechanism has at least two swivelling levers connected to each other via the actuator and at least one contact retainer, on which the switch contact is arranged. The contact retainer connecting the two swivelling levers in its longitudinal direction with a lever arm is larger than the actuator and is configured so it can be deflected transverse to its longitudinal direction.

According to the invention, the switch mechanism therefore forms a type of lever transmission, in which the actuator is switched between the swivelling levers and moves them, for example, towards each other or away from each other. As a result of the larger lever arm on the contact retainer, the swivelling lever movement caused by the actuator is transformed into an increased transverse deflection of the contact retainer. The transverse deflection leads to the switching movement. This arrangement is particularly suited for use with actuators with low lift and can be improved by the configurations described hereinafter, each of which is advantageous in itself.

In one configuration, the switch mechanism can thus be configured symmetrically in relation to a bisector of the angle between the swivelling levers. Another problem of the known relays with leverage, such as the one in EP 1 626 427 A2, is that the switching movement does not run rectilinearly, but in a curve, so that the switch contact and the mating contact have to be rounded in order to avoid a spark resulting from a non-uniform approach. This configuration, however, leads to increased production costs and to a smaller area of contact between the switch contact and the mating contact, which in turn increases the transition impedance between the switch contact and the mating contact.

The symmetrical configuration of the switch mechanism means that the switch contact carries out a rectilinear switching movement in a simple manner. The rectilinear switching movement prevents the individual parts of the switch contact, which approach the mating contact faster than other parts, from causing a spark. Also, the contact surfaces of the switch contact and mating contact can be constructed flat and large, due to the rectilinear switching movement.

In particular, the switch contact can be arranged on the bisector in this configuration, and the switching movement can take place on the bisector.

In order to reduce the number of components to be used in the construction of the electrical switch element, and to reduce the cost of assembly as a result, the two swivelling levers can be connected to each other in one piece at one end. In particular, the two swivelling levers can be arranged in the form of a fork or shears.

A retaining portion can be constructed at one end of the swivelling levers, either one on each or one common one, on which the swivelling levers are retained inside the switching element, so that the swivelling levers have one fixed and one freely movable end. Particularly in the case of rigid swivelling levers, which do not or only negligibly bend resiliently in the course of the driving movement, the retaining portion should enable a movement of the swivelling levers relative to each other and form a joint, for example.

If the two swivelling levers are connected to each other in one piece, then a common retaining portion can be provided, particularly in the connecting region of the two swivelling levers. The two swivelling levers can both be fixed in this manner in one place simply by one single retainer, which reduces the space needed and the assembly time.

In another advantageous embodiment, it is possible, as mentioned above, to enable the swivel axis of at least one swivelling lever through a jointed linkage of the swivelling lever on the retaining portion, for example, by a bushing pivotally mounted on a pin at one end of the swivelling lever. Because this is costly in terms of production and assembly technology, however, it is preferable for the swivel axis of at least one swivelling lever to be integrated in one piece in the swivelling lever. This can be achieved through an attenuation region, for example. A region is to be considered as an attenuation region in this case where the deformability is increased relative to the adjacent region. Such an attenuation region can, for example, result from a cross-sectional decrease, that is from an increase of the bending stresses arising in the cross-section of the swivelling lever, using concentration of stress, or through an increase in the material resilience, for example, by the use of other softer, more resilient materials in the attenuation region. If the swivelling lever is moved by the actuator in this configuration, then a preferably resilient deformation takes place in the attenuation region and the swivelling lever pivots around the attenuation region, which thus forms the swivel axis.

The amount of space taken up by the switch mechanism in the electrical switch element can be reduced by reducing the distance between the swivelling levers in the direction of their at least one swivel axis. Space is thus created in the region of the at least one swivel axis. Also, this embodiment enables greater lift at the ends of the swivelling levers turned away from the at least one swivel axis.

In another advantageous embodiment, at least one swivelling lever can be configured at least in certain regions as a flexion spring that can be deflected resiliently transverse to its longitudinal range. In an advantageous manner the reset force created by the swivelling lever is opposed to the driving force created by the actuator in the process. In this embodiment, the swivelling lever consequently acts simultaneously as a returning spring, which can guide the switch mechanism back to a defined initial position when the actuator is switched off. The portion serving as a flexion spring between the swivel axis of the swivel lever and the connecting point is preferably arranged between the swivel lever and the actuator and/or coincides with the attenuation region.

Alternatively or additionally to the configuration, at least in certain regions, of the swivelling lever as a flexion spring, the contact retainer can also be configured as a spring element opposing the actuator, for example as a leaf spring, which is preferably mounted on both sides to the two swivelling levers.

The switching movement of the switch contact, which it makes when the actuator is activated, can be in the same plane as the swivelling lever in the embodiment according to the invention, or at an angle to this plane. In order to dictate the direction of the switching movement in a simple manner, the contact retainer can extend in the direction of the switching movement at least in certain regions beyond a straight line, which connects the two connecting points of the contact retainer to the at least two swivelling levers.

The at least one actuator can have at least one driving member that is variable in length, which is configured so as to be transferable from a first operating status into a second operating status when fed with electrical power, a longitudinal dimension of the driving member being different in the second operating status to that in the first operating status. These types of driving members are piezoelectrical switch elements or carbon nanotubes, for example. The latter are to be preferred to piezoelectrical elements, because they have higher operating forces and a higher wear resistance as a result of their higher resilience.

BRIEF DESCRIPTION OF THE DRAWINGS

The invention is described hereafter by way of example using two embodiments with reference to the drawings. The different characteristics of the two embodiments and the advantages to be achieved through them can be combined with each other at will in the process or left out, as emerges from the above embodiments. In the drawings.

DETAILED DESCRIPTION OF THE EMBODIMENT(S)

Figure 1:
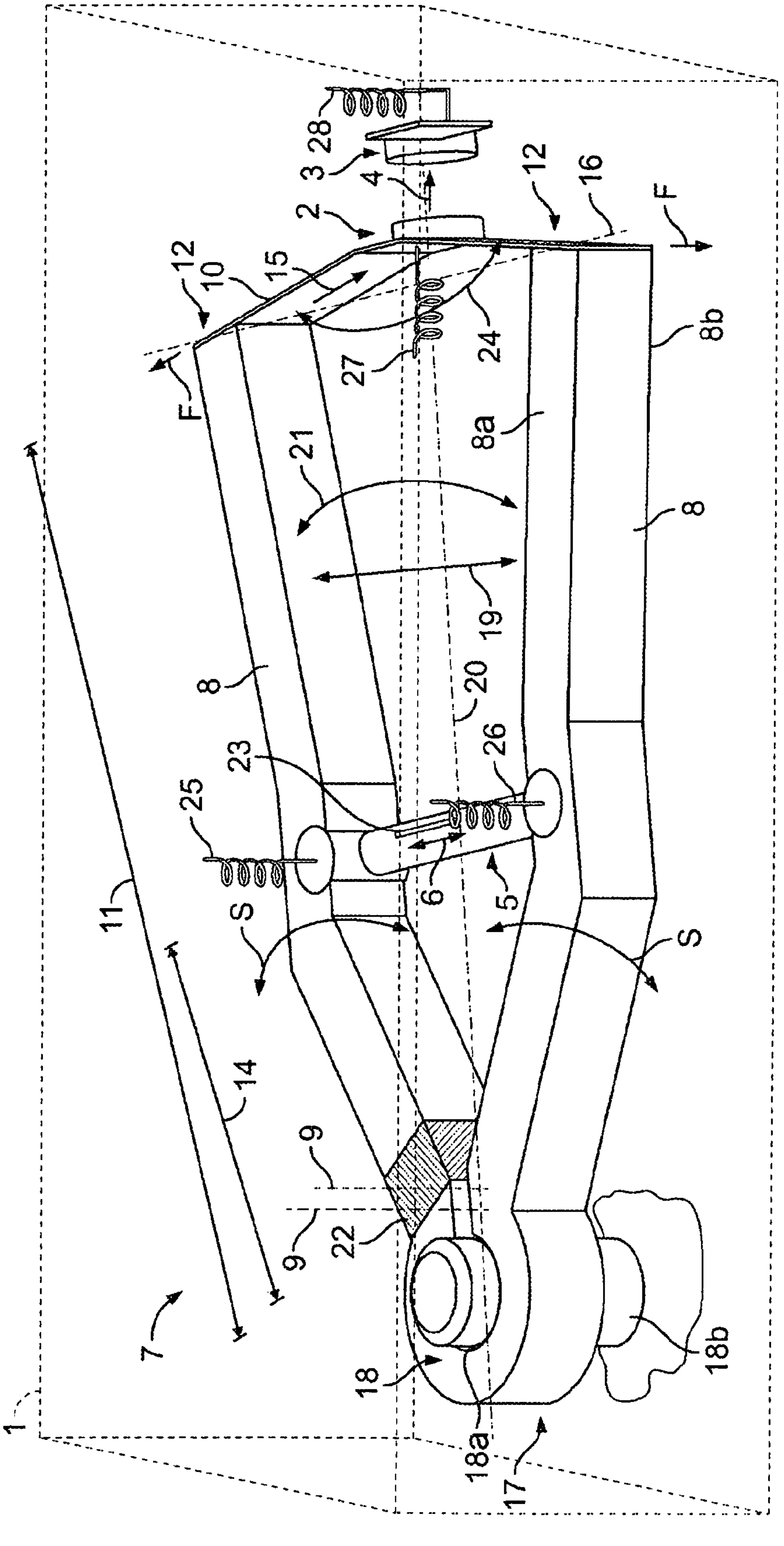
FIG. 1 shows part of an electrical switch element according to a first embodiment according to the invention in a schematic perspective view.

The construction of an electrical switch element 1 configured according to the invention, here a relay, is described first using the embodiment shown schematically in FIG. 1. The electrical switch element 1 is simply indicated by dotted lines in FIG. 1.

The electrical switch element 1 is provided with at least one movable switch contact 2, for example, in the form of a tablet-shaped contact, and a preferably stationary mating contact 3, which can be brought into or out of electrically conductive contact with each other in the course of a switching movement 4.

The electrical switch element 1 is also provided with an actuator 5, which creates a driving movement 6 when activated.

In order to translate the driving movement 6 into the switching movement 4 of the switch contact 2, a switch mechanism 7 is arranged between the actuator 5 and the switch contact 2 in a work direction. The direction in which the switch contact 2 moves when the actuator 5 contracts is described hereinafter as the switching movement 4.

The switch mechanism 7 has at least two swivelling levers 8, which are retained inside the electrical component 1 so as to pivot about a common swivel axis 9 or at least one axis each. The swivelling levers 8 are connected to each other via the actuator 5 in its longitudinal direction.

The switch mechanism 7 also has at least one contact retainer 10, on which the switch contact 2 is arranged. The contact retainer 10 likewise connects the two swivelling levers 8 to each other and is switched mechanically parallel to the actuator 5. In order to counterbalance pivotal movements S of the swivelling levers 8, the actuator 5 and the contact retainer 10 are articulated to the swivelling levers 8.

A lever arm 11 between a connecting point 12 of the swivelling lever 8 to the contact retainer 10 and the swivel axis 9 of the respective swivelling lever 8 is larger in this case than a lever arm 14, with which the actuator 5 touches the respective swivelling lever 8. The contact retainer 10 can be arranged on a free end of the swivelling lever 8 for this purpose. The contact retainer 10 is preferably configured so it can be resiliently deflected transverse to its longitudinal direction 15, in which it extends between the two swivelling levers 8. The contact retainer 10 can be formed particularly as a leaf spring of metal or metal alloy, which is resiliently deformable in its transverse direction, as shown in FIG. 1. The direction of deflection coincides in the process with the direction of the switch movement 4, for example, as shown in the embodiment of FIG. 1.

The contact retainer 10 extends at least in certain regions in a direction of the switching movement 4 beyond an imaginary straight line 16, which connects the connecting points 12. The portion upon which the switch contact 2 is located preferably lies beyond the straight line 16.

The two swivelling levers 8 can be connected to each other in one piece, particularly in the region of the swivel axis 9. The connecting region 17 connecting the two swivelling levers 8 can form a retention device 18 for the switch mechanism 7, to which the switch mechanism 7 is movably fixed inside the electrical switch element 1. The connecting region 17 can particularly be configured as a hollow cylindrical clamp 18_a_, as shown in FIG. 1, which is pushed axially with resilient expansion onto a pin 18*b* that is mounted inside the electrical switch element 1 and fixed by friction.

A distance 19 between the swivelling levers 8 increases in a direction of the swivel axis 9 up to the contact retainer 10, so that the swivelling levers 8 form a substantially flat fork, in the planes of which the actuator 5 and, at least in the embodiment shown in FIG. 1, the contact retainer 10 are located.

The switch mechanism 7 is constructed symmetrically in relation to a bisector 20 of an angle 21 set by the swivelling levers 8 or in relation to a symmetry plane running through the bisector 20 perpendicular to the plane of the swivelling lever 8, the switch contact 2 and the mating contact 3 are likewise located on the bisector 20 or in the symmetry plane.

The swivelling levers 8 do not have to have an exactly defined or linear swivel axis 9, as shown in FIG. 1. On the contrary, the swivel axis 9 can be determined by a more expanded deformation region, in which the deformation of the swivelling levers 8 is restricted by the driving movement 6 of the actuator 5.

Such a deformation region can, for example, be achieved by the creation of an attenuation region 22, which is indicated in FIG. 1 by shading on one swivelling lever 8. The deformability inside the attenuation region 22 relative to the other, particularly adjacent regions of the swivelling lever 8 is realized, for example, by a cross-sectional decrease in the swivelling lever 8 and/or a change in material properties to a lesser modulus of elasticity. In the case of a resilient deflection of the swivelling levers 8 resulting from the driving movement 6, the attenuation regions 22 act as return springs, which assume an initial position, as opposed to the switch position assumed at the end of the switching movement, when the actuator 5 is not activated, which characterizes an inactive initial condition of the switch element 1.

The swivelling levers 8 can be manufactured from plastics material, preferably in an injection molding process, or from sheet metal, preferably in a stamping process. If the swivelling levers 8 can be resiliently deflected along their whole length, then their modulus of elasticity should be greater than the modulus of elasticity of the contact retainer 10, thus ensuring the transverse deflection of the contact retainer 10.

The actuator 5 has at least one driving member 23 which is variable in length, which is simply indicated schematically in FIG. 1. The driving member 23, which is variable in length, can be a piezoelectric element, but is preferably a carbon nanotube.

In the embodiment shown in FIG. 1, the switch mechanism 7 with the two swivelling levers 8 and the contact retainer 10 forms a flat lever mechanism, which, as a result of its symmetry, moves the switch contact 2 in a rectilinear switching movement 4 along the bisector 20 or the symmetry plane running transverse to the plane of the lever mechanism through the bisector 20 with a greater lift than the driving lift of the actuator 5.

In order to further increase the movement of the switch contact 2 beyond the proportions of the levers 11, 14, the angle 24 set by a straight line between the switch element 2 and the two connecting points 12 of the contact retainer 10 can be greater than the angle 21 set by the swivelling levers 8 between the swivel axis 9 and the connecting points 12. The angle 24 is between 45° and 90°, preferably between 60° and 90°.

The function of the embodiment in FIG. 1 is described hereinafter.

The actuator 5 is actuated by a switching current from lines 25, 26 outside the electrical switch element 1. The switching current causes a change in length of the driving member 23 of the actuator 5, which leads to the driving movement 6. In the course of the driving movement 6, the swivelling levers 8 are moved from their initial position, towards each other, for example. The swivelling levers 8 swivel about their swivel axes 9 towards each other in the process, so that the distance between them decreases. As a result of the symmetrical configuration of the switch mechanism 7, the movement of the swivelling levers 8 is likewise symmetrical. Because of the longer lever arm 11 of the contact retainer 10 compared to the lever arm 14 of the actuator 5, and because of the size ratio of the angles 21, 24, the lift of the driving movement 6 increases at the position of the switch contact 2.

The movement of the swivelling levers 8 is transformed by the switch mechanism 7 into a transverse deflection of the contact retainer 10 and of the switch contact 2 mounted on the contact retainer 10, i.e. into the switching movement 4. The direction of the transverse deflection is clearly determined by the extension of the contact retainer 10 in the direction of the switching movement 4 beyond the straight line 16.

Since the contact retainer 10 is configured as a leaf spring, its deflection in the course of the switching movement 4 is reversible and leads to a reset force acting against the driving movement 6, which moves the swivelling levers 8 back into the initial position when the actuator 5 is switched off.

If the switch contact 2 contacts the mating contact 3 at the end of the switching movement 4, then lines 27, 28, which are electrically conductively connected to the switch contact 2 and the mating contact 3, are connected to each other. A switching circuit located outside the electrical switch element 1 and connected to the lines 27, 28 is correspondingly made.

The above embodiments are correspondingly valid for configurations of the switch element 1, in which the actuator 5 carries out the driving movement 6, which leads to its extension, or in which the switch contact 2 is moved away from the mating contact 3 in the course of the switching movement 4 and is located in the initial position on the mating contact 3 when the actuators is switched off. Only the directions of the driving movement 6, the switching movement 4 or a reset force F changes in these modifications. If, as a variation to FIG. 1, the switch contact 2 is moved onto the mating contact 3 in the initial position, for example, then the actuator 5 can push the swivelling levers 8 apart according to a variation and thus move the switch contact 2 away from the mating contact 3 against the positioning force of the contact retainer 10. Moreover, in another variation, the switch contact 2 can be brought into contact with the mating contact 3 not, as in FIG. 1, by a movement of the swivelling levers 8 towards each other, but rather by a movement away from each other. For this purpose, the mating contact 3 must simply be arranged on the other side of the contact retainer 10 to that shown in FIG. 1.

Additionally or alternatively to the configuration of the contact retainer 10 as a return spring, the swivelling levers 8 can also serve as return springs if, for example, the attenuation region 22 or a deformation region arranged between the swivel axis 9 and the connecting points of the actuator 5 to the swivelling levers 8 creates a resilient reset force.

The spatial location of the contact retainer 10 on the swivelling levers 8 can be fixed according to the spatial requirements of the relay. For example, the spring retainer 10 can be arranged at an angle of 90° or another angle on a surface of the swivelling levers 8 referenced as upper face 8*a* or lower face 8*b* in FIG. 1, so that the switching movement 4 runs vertically or at another angle to the plane set by the swivelling levers 8.

Figure 2:
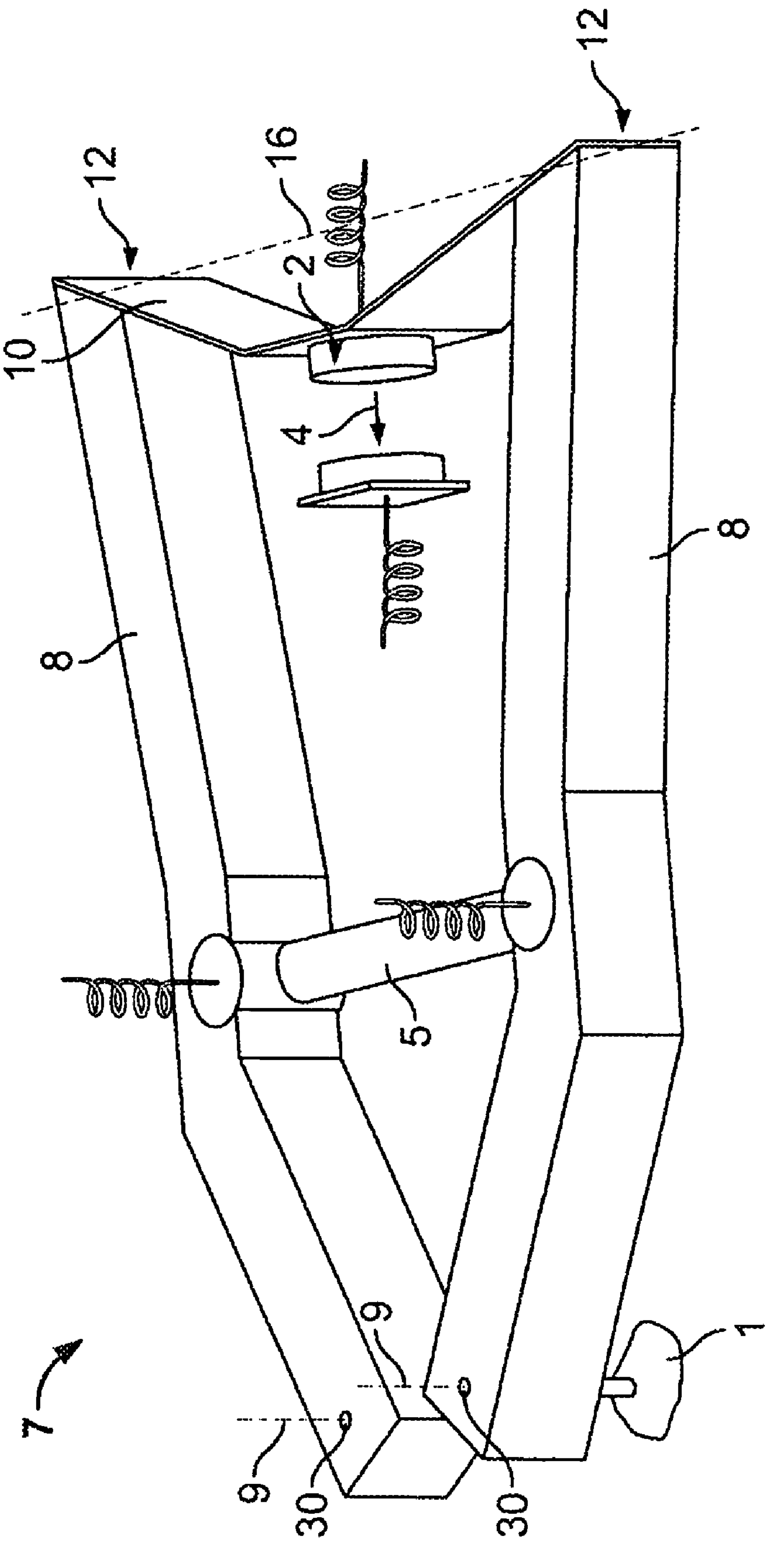
FIG. 2 shows part of an electrical switch element according to a second embodiment according to the invention in a schematic perspective view.

Another embodiment of the switch mechanism 7 with actuator 5 is shown in FIG. 2. For the sake of brevity, only the differences to the embodiment in FIG. 1 will be considered.

The reference numerals of FIG. 1 will also be used so far as they relate to elements in FIG. 2 with identical function.

In the embodiment in FIG. 2, the contact retainer 10 does not extend towards the outside of the region between the swivelling levers 8, as in FIG. 1, that is away from the swivel axes 9, but rather into this region, towards the swivel axes 9. This leads to a particularly compact construction. The switch contact 2 is also located here in the direction of the switching movement 4 beyond the imaginary straight line 16 of the connecting points 12 of the contact retainer 10 to the swivelling levers 8. The movement which is carried out when the actuator 5 is shortened by the switch contact 2 is again described as the switching movement 4 in this case.

Furthermore, the swivelling levers 8 are not connected to each other in one piece in the configuration in FIG. 2, but rather are two separate rigid members, which are pivotally mounted on pins 30 connected rigidly to the electrical component 1. The pins 30 form the swivel axes 9. As can be seen in FIG. 2, the swivel axes 9 are located at one fixed end of the swivelling levers 8.

Further variations of the embodiments shown in FIGS. 1 and 2 and described above are, of course, possible. For example, the configuration of the contact retainer 10 as a spring element can be omitted if the actuator 5 is able to accomplish the return of the switch mechanism 7 into its initial position by itself. Also, a plurality of switch contacts 2 can be activated simultaneously by the swivelling levers 8. This can be achieved by affixing a plurality of contact retainers 10 with respective and variously aligned switching movements 4. Also, the swivelling levers 8 can be extended along the swivel axis 9. Finally, the actuator 5 can also be arranged beyond the swivel axis 9, so that the switch mechanism 7 is constructed like shears.

The invention claimed is:

1. An electrical switch element comprising:

at least one actuator having at least one driving member having carbon nanotubes;

at least one switch contact being movable through driving movement of the actuator; and, a switch mechanism having at least two swivelling levers connected to each other via the actuator and at least one contact retainer, on which the switch contact is arranged, the contact retainer connecting the two swivelling levers in its longitudinal direction with a lever arm which is larger than the actuator, and constructed so it can be deflected transversely to its longitudinal direction.

2. The electrical switch element according to claim 1, wherein the switch mechanism is configured symmetrically in relation to a bisector of an angle enclosed between the swivelling levers.

3. The electrical switch element according claim 1, wherein the two swivelling levers are connected to each other in one piece in the region of their swivel axis.

4. The electrical switch element according to claim 3 wherein in the region the swivel axis, a retaining portion is constructed, on which the swivelling levers are movably retained inside the switch element.

5. The electrical switch element according to claim 4, wherein the retaining portion connecting the two swiveling levers forms a retention device.

6. The electrical switch element according to claim 5, the retaining portion is figured as a hollow cylindrical clamp which is pushed axially with resilient expansion onto a pin that is mounted inside the electrical switch element and fixed by friction.

7. The electrical switch element according to claim 3, wherein the swivel axis is integrated as one piece in at least one swivelling lever.

8. The electrical switch element according to claim 7, wherein the swivel axis is formed by an attenuation region, in which the deformability of the swivelling lever is increased relative to the regions adjacent to the attenuation region.

9. The electrical switch element according to claim 3 wherein a distance between the swivelling levers decreases in a direction of the swivel axis.

10. The electrical switch element according to claim 1 wherein at least one of the swivelling levers is configured as a flexion spring that can be deflected resiliently transverse to its longitudinal range opposing the driving movement of the actuator.

11. The electrical switch element according to claim 1 wherein the at least two swivelling levers are freely movable at one end and at the other are clamped whereby the contact retainer connects the freely movable ends of the swivelling levers to each other.

12. The electrical switch element according to claim 1 wherein the contact retainer is a spring element opposing the driving movement of the actuator.

13. The electrical switch element according to claim 12, wherein the contact retainer is a leaf spring.

14. The electrical switch element according to claim 1 wherein the switch contact is located in the region of the bisector.

15. The electrical switch element according to claim 1 wherein the contact retainer extends in a direction of switching movement at least in certain regions beyond a straight line, which connects the two connecting points of the contact retainer to the at least two swivelling levers.

16. The electrical switch element according to claim 15 wherein the switching movement of the switch contact runs substantially rectilinearly along the bisector.

17. The electrical switch element according to claim 1 wherein the at least one actuator has at least one driving member that is variable in length, which is configured so as to be transferable from a first operating status into a second operating status when fed with electrical power, a longitudinal dimension of the driving member in the longitudinal direction of the actuator being different in the second operating status to that in the first operating status.

* * * * *